United States Patent [19]

Wechsler

[11] 4,192,993

[45] Mar. 11, 1980

[54] STATIC DIGITAL DATA ENTRY METHOD AND APPARATUS FOR A TIMER OR CLOCK

[75] Inventor: Reuben Wechsler, Phoenix, Ariz.

[73] Assignee: Motorola, Inc., Schaumburg, Ill.

[21] Appl. No.: 8,201

[22] Filed: Jan. 31, 1979

Related U.S. Application Data

[63] Continuation of Ser. No. 763,399, Jan. 28, 1977, abandoned.

[51] Int. Cl.$^2$ .............................................. H03K 21/36

[52] U.S. Cl. .......................... 235/92 DE; 235/92 PE; 235/92 EV; 235/92 MP; 235/92 T

[58] Field of Search ........... 235/92 PE, 92 T, 92 DE, 235/92 MP, 92 EV, 92 ST, 92 CV; 328/48; 340/347 P, 347 AD

[56] References Cited

U.S. PATENT DOCUMENTS

| | | | |
|---|---|---|---|
| 2,669,388 | 2/1954 | Fox | 235/92 PE |
| 3,100,298 | 8/1963 | Fluhr | 340/347 AD |
| 3,211,897 | 10/1965 | Kaufman | 235/92 CV |
| 3,418,653 | 12/1968 | Robinson | 340/347 P |
| 3,564,217 | 2/1971 | Bounsall | 235/92 PE |
| 3,604,903 | 9/1971 | Hill et al. | 235/92 PE |
| 3,665,323 | 5/1972 | Peterson | 235/92 EV |
| 3,789,195 | 1/1974 | Meier et al. | 235/92 PE |
| 3,843,873 | 10/1974 | Beville et al. | 235/92 EV |
| 3,914,581 | 10/1975 | Gilson | 235/92 CV |

*Primary Examiner*—Joseph M. Thesz

*Attorney, Agent, or Firm*—Vincent B. Ingrassia

[57] ABSTRACT

A data system and method for entering, storing and displaying a desired digital time which replaces a conventional input keyboard, rotary switch, or thumbwheel switch for a digital timer or clock. This system processes the voltage from a manually positioned wiper of a potentiometer through an inexpensive analog-to-digital converter, displays the digital data to the operator for identification, and holds the data for further processing. The operator repositions the wiper so as to sequentially display a digital time in response to a static or steady state digital signal until the desired digital time is displayed.

11 Claims, 2 Drawing Figures

STATIC DIGITAL DATA ENTRY METHOD AND APPARATUS FOR A TIMER OR CLOCK

This is a continuation, of application Ser. No. 763,399, filed Jan. 28, 1977, now abandoned.

BACKGROUND OF THE INVENTION

This invention relates to a method and apparatus for entering digital data into a display timer or clock.

In the past, the most prevalent device for transferring data from an operator into a data processing system has been a keyboard. Although the keyboard is universally used for entering data, rotary switches with discrete positions and thumbwheel switches with discrete positions have also been used in certain specific applications. However, all of these devices inherently require relatively expensive hardware. This drawback is especially disadvantageous in a highly competitive market such as the household appliance market.

Another type of device which is relatively inexpensive but inconvenient to use is an operator controlled oscillator which cycles a system through each of the digital states allowed by the system until the desired digital number appears on the display. This type of input is most commonly used to set the time on digital clocks. However this device is not well suited for other data entry applications where essentially random data is to be entered due to the inconvenience of cycling through all of the possible states and then stopping exactly on the desired state.

Therefore, it can be appreciated that a data entry device and method which is both inexpensive and convenient to use is highly desirable.

Accordingly, an object of this invention is to provide an inexpensive apparatus and method to enter data into a digital timer or clock.

It is another object of this invention to provide a data entry apparatus and method which utilizes an analog-to-digital converter which has a conversion error in excess of the maximum data entry system error.

Yet another object of this invention is to provide a digital entry system which holds the input time while the initial time is being processed so that the original time can be reentered again without operator adjustment.

BRIEF SUMMARY OF THE INVENTION

The present invention relates to a digital data entry method for visually displaying an operator desired digital time which processes a voltage from a manually positioned wiper of a potentiometer through an inexpensive analog-to-digital converter, and displays the digital data to an operator for identification. The operator then repositions the wiper so as to sequentially display digital time in response to static or steady state digital signals until the desired digital time is displayed.

The present invention also relates to a digital data entry apparatus for visually displaying an operator desired digital time which comprises a means for producing an analog voltage in response to a mechanical position. A converter quantitizes the analog voltage into a steady state discrete level. Means for displaying a digital representation of the steady state discrete level allows an operator to identify the steady state discrete level and to adjust the mechanical position until the digital representation corresponds to the operator desired digital time.

DESCRIPTION OF THE PREFERRED EMBODIMENTS

Figure 1:
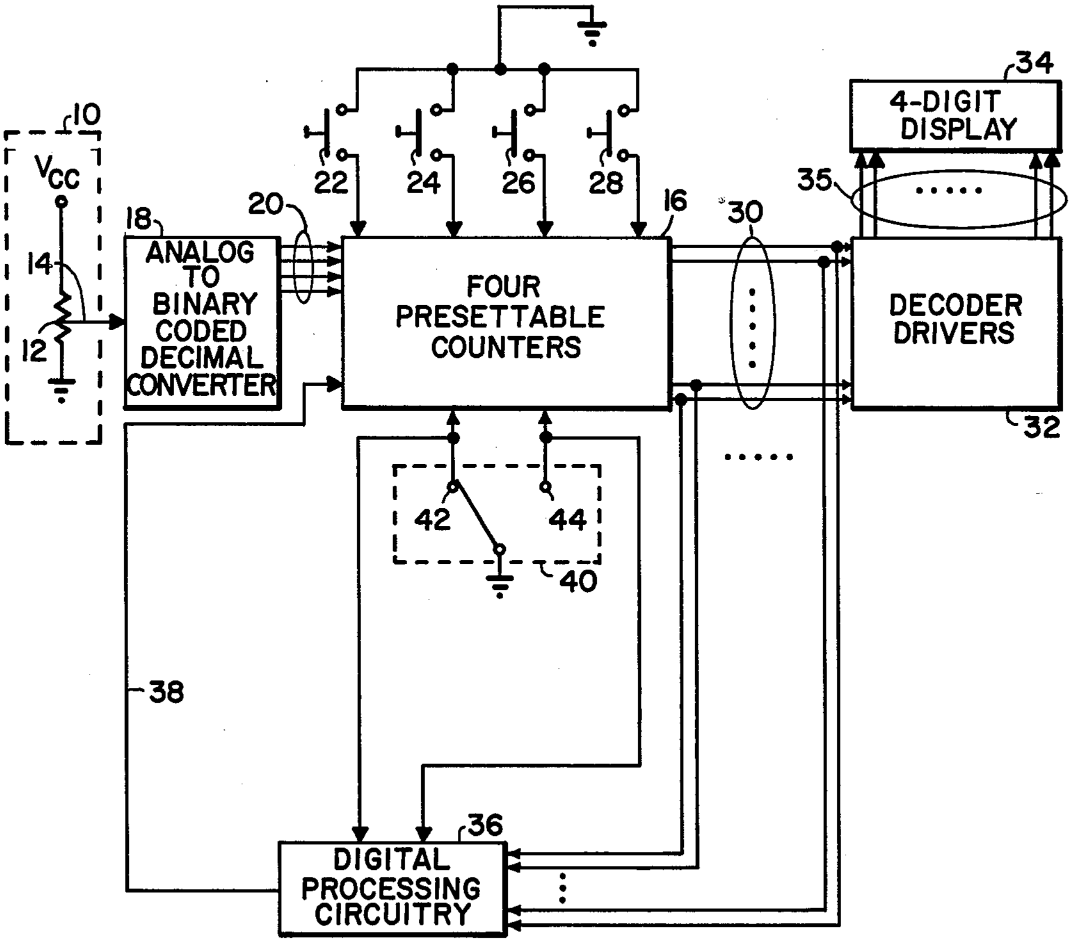
FIG. 1 depicts the block diagram logical schematic of the invention in one embodiment.

Now referring to FIG. 1, a variable operator input 10 comprises a potentiometer 12 which is manually adjusted by an operator. In order to convert the analog voltage appearing on the wiper 14 of the potentiometer 12 into a form suitable for binary storage and counting as performed by four presettable counters 16, an analog-to-binary-coded-decimal converter 18 translates the voltage at the wiper 14 into a 4 bit digital number which is impressed on interconnecting lines 20 and thereby into the four presettable counters 16. A second set of operator controlled inputs comprising enable switches 22, 24, 26 and 28, connected to the presettable counters 16, provide means for individually addressing each of the four counters and enabling their contents to be responsive to the variable operator entry 10. Connecting lines 30 couple the outputs from each of the four presettable counters 16 into the decoder drivers 32 which in turn drive the output four digit display 34 via interconnect lines 35. The display 34 provides a visible decimal representation of the state of the presettable counters 16 to the operator. Also coupled to the output lines 30 is digital data processing circuitry 36 which in turn provides a clock pulse on line 38 back to the presettable counters 16. The digital processing circuitry 36 is any one of various types well known to those skilled in the art. A third operator input consists of a mode switch 40 whereby the operator either inhibits the count down of the presettable counters 16 and the digital processing circuitry 36 and enters data into the counters via the potentiometer 12, or enables the processing circuitry and the presettable counters during which time the counters are responsive to the clock input line 38.

For purposes of illustrating the function of the present invention, it will be assumed for example that operator wishes to operate a heating process for 18 minutes and 54 seconds. The operator first places the mode control switch 40 into the enter data position 42 thereby disabling the clock inputs conducted by line 38 to the presettable counters 16 and inhibiting the digital processing circuitry 36. Next, the operator actuates enable switch 22 corresponding to the left most digit and observes the display 34 while rotating the manual entry potentiometer 12 until the number 1 appears in the leftmost digit. In a similar manner, the operator actuates enable switches 24, 26 and 28 while observing the corresponding display digit and adjusting the potentiometer until the display reads 1, 8, 5, 4. At this time, the presettable counters 16 are preset to the number shown on the display 34, that is 18 minutes and 54 seconds, and this information is transferred via the output lines 30 to the digital processing circuitry 36. The operator then switches the mode control switch 40 to the operate position 44 which enables the digital processing circuitry 38 to begin the timed heating process, and causes the presettable counters 16 to start counting down from 18 minutes and 54 seconds in response to the clock pulse on line 38. The digital processing circuitry 36 continually monitors the state of the counters while controlling the heating process. When the digital processing circuitry 36 senses that the proper time has passed, that is the presettable counters 16 have counted down to zero, then the heater will be shut off.

The embodiment of FIG. 1 has the advantage of permitting the use of an inexpensive potentiometer and an inexpensive analog-to-binary-coded-decimal converter since the accuracy of-the-A to BCD converter is not important. The accuracy of the potentiometer 12 and the analog-to-binary-coded-decimal converter 18 is not important in this application since the digital equivalent of the output of the analog-to-binary-coded-decimal converter 18 is displayed back to the operator via the display 34 for verification and adjustment of the potentiometer 12 if necessary. Thus, the resultant data entry error is much less than the conversion error of the A-to-D converter. Also, this is a static data entry system since each potentiometer position corresponds to a single digit on the display, which results in a convenient and simple data entry system.

Figure 2:
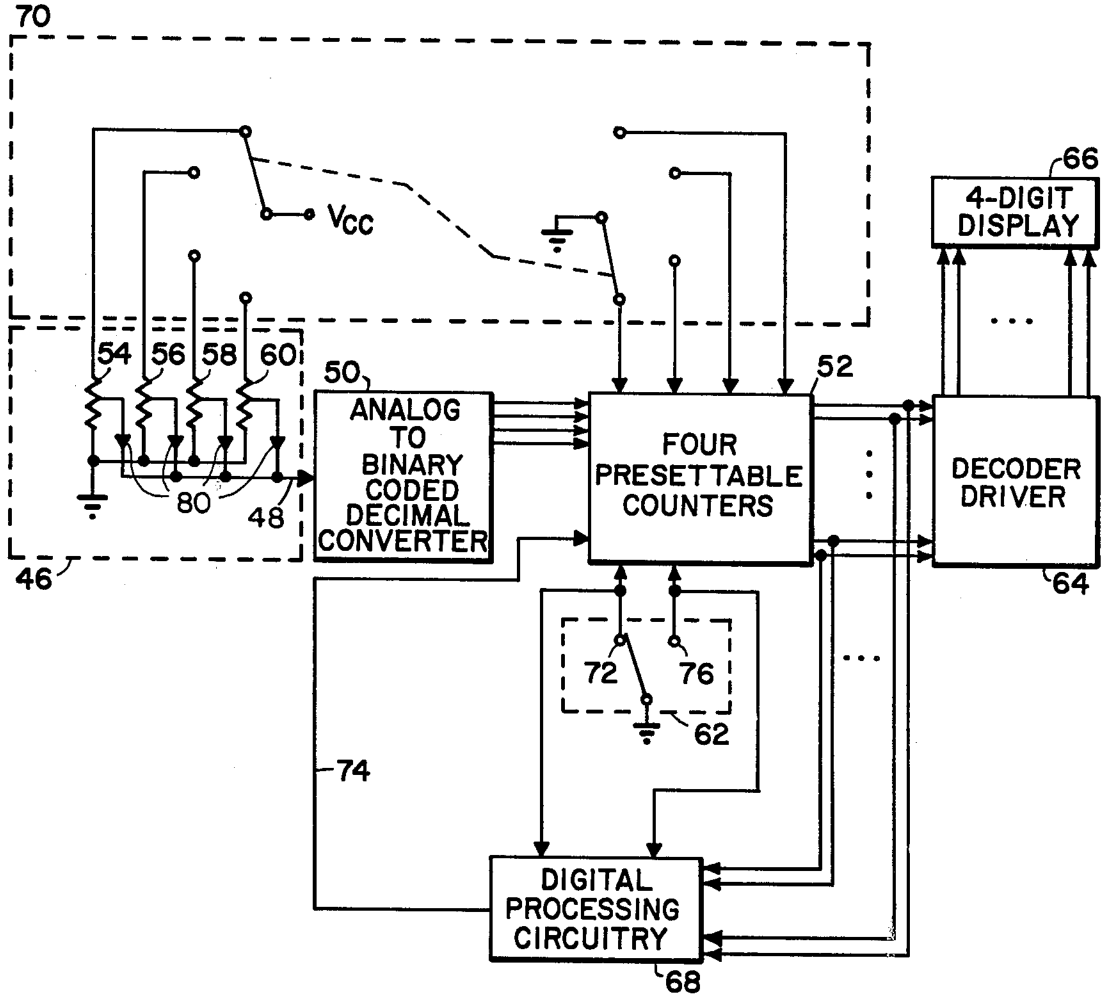
FIG. 2 is a block electrical diagram of the invention in a second embodiment.

The second embodiment of the invention, shown in FIG. 2, is very similar to the embodiment of FIG. 1. A variable operator input means 46 produces an analog voltage at line 48 which is digitized by an analog-to-binary-coded-decimal converter 50 and transferred to four presettable counters 52. Although the potentiometer 12 of FIG. 1 has been replaced by four potentiometers, 54, 56, 58, and 60 in FIG. 2, the analog-to-binary-coded-decimal decoder 50, the four presettable counters 52, the mode switch 62, the decoder drivers 64, the display 66 and the digital processing circuitry 68 and their corresponding interconnections are all identical to the corresponding blocks and connections of FIG. 1. Added to the circuit of FIG. 1 is a multiplexor 70 which selects one of the four potentiometers 54, 56, 58 or 60 and at the same time enables one of the four presettable counters of block 52 to be responsive to the output of the analog-to-binary-coded-decimal converter 50. The multiplexor 70 applies a DC voltage to each of the four potentiometers, 54, 56, 58 and 60 in turn, thereby coupling the analog voltage equivalent of the potentiometer wiper position through the isolating diodes 80 into the analog-to-binary-coded-decimal converter 50 to be encoded into digital signals. These digital signals are fed into the corresponding presettable counter selected by the multiplexor. As before, each of the four presettable counter outputs is coupled into the decoder driver 64 which converts the digital signals into the proper signals to drive the display 66.

The operator, in using the embodiment of FIG. 2, would first set the mode switch 62 into the enter data position 72. With mode switch 62 in this position, the digital processing circuitry 68 is inhibited, the clock input 74 to the presettable counter 52 is inhibited, and each of the counters are being enabled in turn by the multiplexer 70 to receive the digital data from the analog-to-binary-coded-decimal converter 50. Since the multiplexor is rapidly sampling each potentiometer 54, 56, 58, and 60 and simultaneously enabling each of the preset inputs to the presettable counters 52, it appears to the operator that the position of each potentiometer is continuously digitally encoded, stored in the presettable counters, and indicated on the display 66. The operator therefore observes the display and adjusts the potentiometers until the display indicates the desired time period. At that point the presettable counters are holding the digital time shown on the displays. Placing the mode control switch 62 in the operate position 76 allows the digital process circuitry to begin its process and allows the presettable counters 52 to down count via the clock input 74. When the digital processing circuitry 36 senses that the proper time has passed, that is the presettable counters 16 have counted down to zero, then the process will be terminated.

This embodiment has the added advantage over the embodiment depicted in FIG. 1 in that the four potentiometer inputs allow the user to re-enter the same time used in the prior operation without having to re-adjust the input potentiometers.

While the invention has been particularly shown and described as reference preferred embodiment thereof, it will be understood by those skilled in the art that various changes in form and detail may be made therein without departing from the spirit and scope of the invention.

What is claimed is:

1. A digital data entry method for visually displaying a digital representation of an operator desired number which comprises:
 (a) positioning manually and approximately a first mechanical member for converting a mechanical position into a steady state electrical analog signal having a first magnitude;
 (b) converting said steady state electrical analog signal to a binary coded representation having a second magnitude, said second magnitude being in a predetermined relationship with said first magnitude;
 (c) displaying digitally a first representation of said binary coded representation to the operator for identification; and
 (d) repositioning said mechanical member and repeating steps (b) and (c) until said digital representation corresponds to the operator desired number.

2. A digital data entry method for visually displaying a digital representation of an operator desired number as in claim 1 further comprising:
 (a) the additional step of storing said binary coded representation in a first storage means for subsequent use by data processing circuitry.

3. A digital data entry method for visually displaying a digital representation of an operator desired number as in claim 2 further comprising:
 (a) repeating steps (a) through (d) of claim 9 for a second, third, and fourth reiteration to enter an operator desired number which is divided into a first, second, third and fourth distinct digital representation; and
 (b) storing said binary coded representation for said second, third and fourth distinct digital representation in a corresponding second, third, and fourth storage means for subsequent use by data processing circuitry.

4. A digital data entry method for visually displaying a digital representation of an operator desired number as in claim 2 further comprising:
 (a) repeating steps (a) through (d) of claim 9 for second, third and fourth mechanical members in addition to said first mechanical member; and
 (b) storing said binary coded representation representative of a mechanical position of said second, third, and fourth mechanical member in a corresponding second, third, and fourth storage means for subsequent use by data processing circuitry.

5. A digital data entry method as set forth in claim 1 wherein the operator desired number is an operator desired time.

6. A digital data entry system for visually displaying a digital representation of an operator desired number comprising:

(a) means responsive to at least a first mechanical position for converting said first mechanical position to a steady state electrical analog voltage having a first magnitude;

(b) conversion means for converting said steady state electrical analog voltage to a binary coded representation having a second magnitude, said second magnitude being in a predetermined relationship with said first magnitude; and (c) means for displaying a digital representation of said binary coded representation for identification by an operator and for subsequent adjustment by said operator of said first mechanical position to provide a subsequent steady state analog voltage until said digital representation corresponds to the operator desired number.

7. A digital data entry system for visually displaying a digital representation of an operator desired number as in claim 6 further including:

(a) means coupled to said conversion means for storing said binary coded representation for use by data processing circuitry.

8. A digital data entry system for visually displaying a digital representation of an operator desired number as in claim 6 further including:

(a) means coupled to said conversion means for storing a first, second, third, and fourth binary coded representation for use by data processing circuitry.

9. A digital data entry system for visually displaying a digital representation of an operator desired number as in claim 8 wherein said means responsive to at least a first mechanical position is responsive to a first, second, third and fourth mechanical position and further comprises:

(a) means for directing said electrical analog voltage from said first, second, third, and fourth mechanical positions into said means for storing a first, second, third, and fourth binary coded representation respectively; and (b) means for displaying a digital representation of said binary coded representation for identification by an operator and for subsequent adjustment by said operator of said second, third, and fourth mechanical positions until said digital representations of said first, second, third, and fourth mechanical positions correspond to the operator desired number.

10. A digital entry system as set forth in claim 6 wherein the operator desired number is an operator desired time.

11. A digital entry system as set forth in claim 6 wherein said conversion means has a conversion error in excess of the data entry error of the digital entry system.

* * * * *